(12) United States Patent
Lee et al.

(10) Patent No.: US 6,235,147 B1
(45) Date of Patent: May 22, 2001

(54) WET-ETCHING FACILITY FOR MANUFACTURING SEMICONDUCTOR DEVICES

(75) Inventors: Seung-kun Lee, Suwon; Jae-hyung Jung, Yongin; Young-hwan Yun, Seoul; Gyu-hwan Kwag, Suwon, all of (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 09/406,887

(22) Filed: Sep. 28, 1999

(30) Foreign Application Priority Data

Sep. 29, 1998 (KR) .............................. 1998-40567

(51) Int. Cl.$^7$ ...................................... B08B 3/02
(52) U.S. Cl. .................... 156/345; 134/1.3; 216/88; 216/85; 216/89
(58) Field of Search .................. 156/345; 134/1.3; 216/88, 85, 89

(56) References Cited

U.S. PATENT DOCUMENTS

| | | | |
|---|---|---|---|
| 5,174,855 | * 12/1992 | Tanaka | 216/99 |
| 5,633,175 | * 5/1997 | Kikuchi et al. | 438/30 |
| 5,672,212 | * 9/1997 | Manos | 134/1.3 |
| 5,698,040 | * 12/1997 | Guldi et al. | 134/1.3 |
| 5,976,311 | * 11/1999 | Han | 156/345 |
| 6,099,686 | * 8/2000 | Sugiuti | 156/345 |

* cited by examiner

Primary Examiner—Jeffrie R. Lund
Assistant Examiner—Sylvia R. MacArthur
(74) Attorney, Agent, or Firm—Cantor Colburn LLP

(57) ABSTRACT

There is provided a wet-etching facility for manufacturing semiconductor devices, wherein the etching process is performed for a wafer with its used surface facing downward so that the by-products from the etching process are completely removed from the etching groove of the wafer by gravity, and the impurities on the back side of the wafer are sank down, and are not touched to the used surface of the other wafer thereby producing good quality of wafers.

The wet-etching facility for manufacturing semiconductor devices comprises a bath containing an amount of chemical; a chemical supply part for supplying an amount of chemical to the bath; a chemical discharge part for discharging the chemical inside the bath to the outside; a wafer guide holding and fixing a wafer with its used surface facing downward, and placing the wafer into a chemical; a transfer robot for loading and unloading the wafer into the wafer guide; and a chemical spray part for spraying the chemical at a high pressure such that the chemical flows along a surface of the wafer.

19 Claims, 11 Drawing Sheets

WET-ETCHING FACILITY FOR MANUFACTURING SEMICONDUCTOR DEVICES

BACKGROUND OF THE INVENTION

1. Field of the Invention

The present invention relates to a wet-etching facility for manufacturing semiconductor devices, and more particularly, to a wet-etching facility for manufacturing semiconductor devices for easily removing the impurities with the used surface of the wafer faced down.

2. Description of the Related Art

Generally, the etching process in the semiconductor devices fabrication processes is a process to selectively remove the most upper layer of the wafer through a photo resist layer having a certain pattern after exposure and development, etc. Normally, a wet-etching or dry-etching method can be used.

The wet-etching process is performed by immersing the wafer into a bath having a certain amount of chemical disposed therein, and causing a chemical reaction with a contacted surface of the wafer so that the unnecessary portion of the wafer is etched by the chemical.

FIG. 1 shows a conventional wet-etching facility to perform the wet-etching process in the semiconductor devices fabrication process.

As shown in FIG. 1, the conventional wet-etching facility comprises a box-shaped bath 110 storing a chemical 3 therein, a chemical supply part (not shown) to supply the chemical 3 to the bath 110 through a chemical opening 110a formed on the bottom of the bath 110, a chemical container 120 to collect the chemical 3 overflowing over the bath 110, a chemical discharge part (not shown) to discharge the chemical 3 collected in the chemical container 120 to the outside through a discharge opening 120a formed on the bottom of the chemical container 120, and a wafer guide 130 to fix the wafer 1 to the slots 130a having a plurality of wafers 1 vertically fit thereinto, the slot 130a aligned with a constant interval, and to place them the wafers 1 into the chemical 3 using a suitable device, such as a robot arm 136.

In the conventional wet-etching facility having a construction as above, the chemical supply part supplies the chemical 3 such that the chemical 3 overflows out of the bath 110 via the chemical opening 110a formed on the bottom of the bath 110, and the flow of the chemical 3 is formed on the surface of the wafer 1 so as to facilitate the chemical reaction between the chemical and the wafer 1.

However, as shown in FIG. 2, since the used surface of the wafer 1 is placed vertically, and the etched impurities 2 of the wafer 1 by the chemical cannot be completely removed therefrom resulting in an amount of etched impurities 2 accumulating on the bottom of the etch groove by gravity. This accumulation of etched impurities 2 is one of the main reasons why a malfunction may occur in the following process and also results in inferior wafers being generated due to the impurities being attached on the used surface of another wafer.

In addition, since the plurality of wafers 1 are vertically aligned inside the slots, there is a possibility that on occasion the upper end of one wafer 1 touches the other wafers, and they are broken since the wafers are shaken during the transfer.

In addition, since a plurality of wafers 1 are horizontally loaded during a transfer, there is required an extra wafer vertical-aligning apparatus to vertically rotate the wafers when the wafers are converted to be into a vertical state. Therefore, the facility is complicated, and productivity is decreased because of the time waste by the wafer vertical-aligning.

In addition, since the bath is box-shaped, and the flow of the chemical is directed from the lower side to the upper side, as anti-gravity direction, particle vortex occurs inside the bath, particularly, on the corners therein or maintenance of chemical thereby resulting in difficulty of the uniform process for wafers.

SUMMARY OF THE INVENTION

The present invention is directed to provide a wet-etching facility for manufacturing semiconductor devices, which obviates one or more of the problems due to the limitation and the disadvantages of the related art.

One object of the present invention is to provide a wet-etching facility for manufacturing semiconductor devices, wherein the etching process is performed for a wafer with its used surface faced down so that the by-products from the etching process are completely removed from the etching groove of the wafer by gravity, and the impurities on the back side of the wafer sink down, and do not touch the used surface of the other wafer thereby producing good quality of wafers.

Another object of the present invention is to provide a wet-etching facility for manufacturing semiconductor devices, wherein the loading/unloading of the wafers can be done with horizontally laid wafers, the wafers are stably stayed during their transfer, and an extra facility is not necessary for vertically aligning the wafers thereby resulting in increased the productivity.

The other object of the present invention is to provide a wet-ething facility for manufacturing semiconductor devices, wherein the shape of the bath is cylindrical, and the flow of the chemical is directed from the upper side to the lower side to be matched with the direction of gravity, so as to prevent the appearance from occurring partial vortex inside the bath or forming a stagnation area of chemical thereby resulting in the uniform process for wafers.

To achieve these and other advantages and in accordance with the purpose of the present invention, the wet-etching facility for manufacturing semiconductor devices comprises a bath containing an amount of chemical; a chemical supply part for supplying an amount of chemical to the bath; a chemical discharge part for discharging the chemical inside the bath to the outside; a wafer guide for holding and fixing a wafer with its used surface facing down, and placing the wafer into a chemical; a transfer robot for loading and unloading the wafer into the wafer guide; and a chemical spray part for spraying the chemical with a high pressure such that the chemical flows along the surface of the wafer.

The chemical supply part and the chemical discharge part are connected via a circulation line including a filter, a pump, and a heater such that some of the chemical discharged from the chemical discharge part, passes through according to the open/close of the valve, and is collected and circulated into the chemical supply part.

The wafer guide comprises left and right moving members having a plurality of slots contacted with the edge of each of the plurality of wafers horizontally held between the slots; and a cylinder installed between the left and right moving members, and extending/contracting the pistons connected with the left/right moving members to control the distance between the left moving member and the right moving member.

The chemical spray part comprises a plurality of nozzles installed on each of the wafers to spray chemical horizontally to the wafers with a high pressure; and a chemical spray line having a plurality of nozzles on its end, and being connected with the chemical supply part to supply chemical to the nozzles.

In addition, the wet-etching facility further comprises a wafer guide rotation apparatus for rotating the wafer guide to rotate the wafer by transmitting the rotation force of the motor to the wafer guide by a driving force transfer apparatus, and further comprises a cleaning solution supply part for supplying the cleaning solution in the bath or the chemical spray part to clean the wafer and the bath, or the chemical dicharge part and the chemical spray part.

In addition, the wet-etching facility for manufacturing semiconductor devices further comprises a cassette stage having a cassette mounted thereon, a plurality of wafers loaded on the cassette; and a wafer aligning apparatus for aligning the plurality of wafers loaded on the cassette on a buffer part so as to face down the used surface of the wafer and align them in a constant interval.

It is to be understood that both the foregoing general description and the following detailed description are exemplary and explanatory and are intended to provide further explanation of the invention.

DETAILED DESCRIPTION OF PREFERRED EMBODIMENTS

Reference will now be made in detail to the preferred embodiments of the present invention, examples of which are illustrated in the accompanying drawings.

Figure 1:
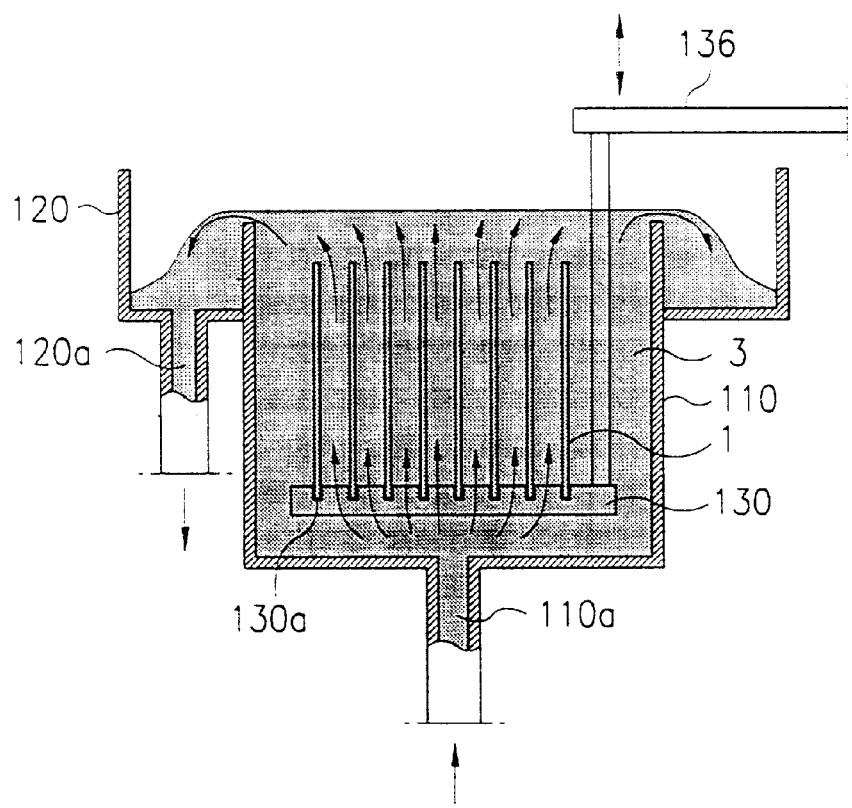
FIG. 1 is a sectional view to schematically show the conventional wet-etching facility for manufacturing semiconductor devices.
Figure 2:
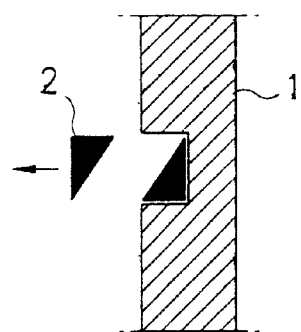
FIG. 2 is a partial enlarged view to show the wafer, of FIG. 1, which is etched by chemical in detail.
Figure 3:
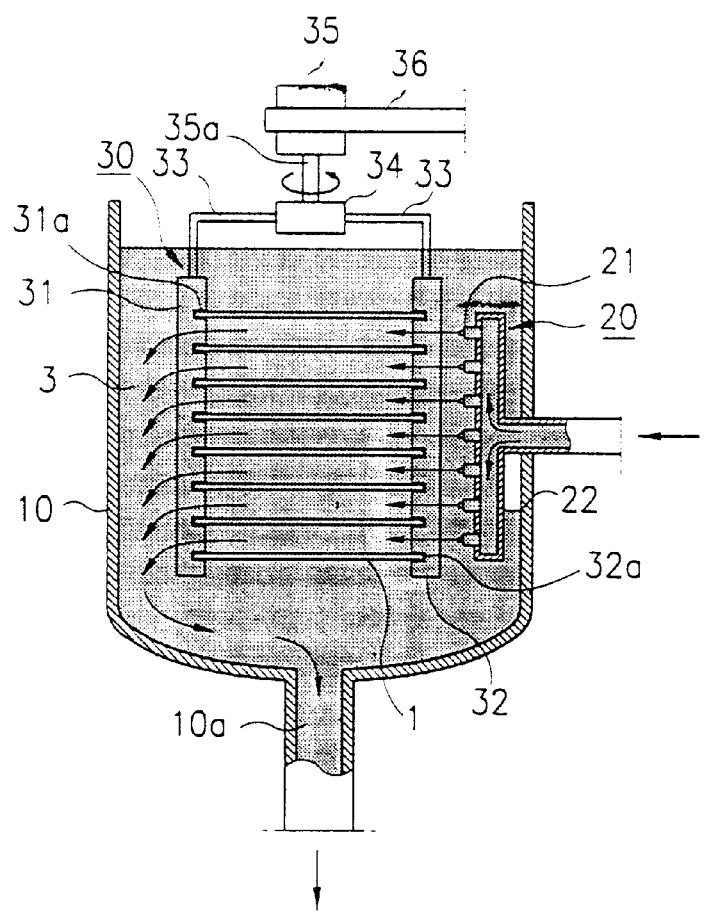
FIG. 3 is a sectional view to schematically show the wet-etching facility for manufacturing semiconductor devices according to one embodiment of the present invention.

Referring to FIG. 3, a wet-etching facility for manufacturing semiconductor devices according to the present invention comprises a bath 10 containing a certain amount of chemical 3, a chemical supply part (not shown) for supplying a certain amount of chemical 3 to the bath 10, a chemical discharge part (not shown) for discharging the chemical contained in the bath 10 to the outside, a wafer guide 30 having a plurality of wafers 1 horizontally held facing downward, and immersing the plurality of wafers 1 into the chemical 3, and a chemical spray part 20 for spraying the chemical 3 with a high pressure such that the chemical 3 flows over the surface of the wafers 1.

The bath 10 is preferably a cylindrically-shaped with its top open. The bottom of the bath 10 is hemispherical-shaped to complete the discharge of the chemical 3 to the outside, and the hemispherical-shaped bottom has a discharge outlet 10a on its lowest point.

Instead of the hemispherical-shaped bottom surface, the bottom can be made of funnel-shape having a discharge outlet on the end so as to facilitate easy discharge of chemical.

Figure 5:
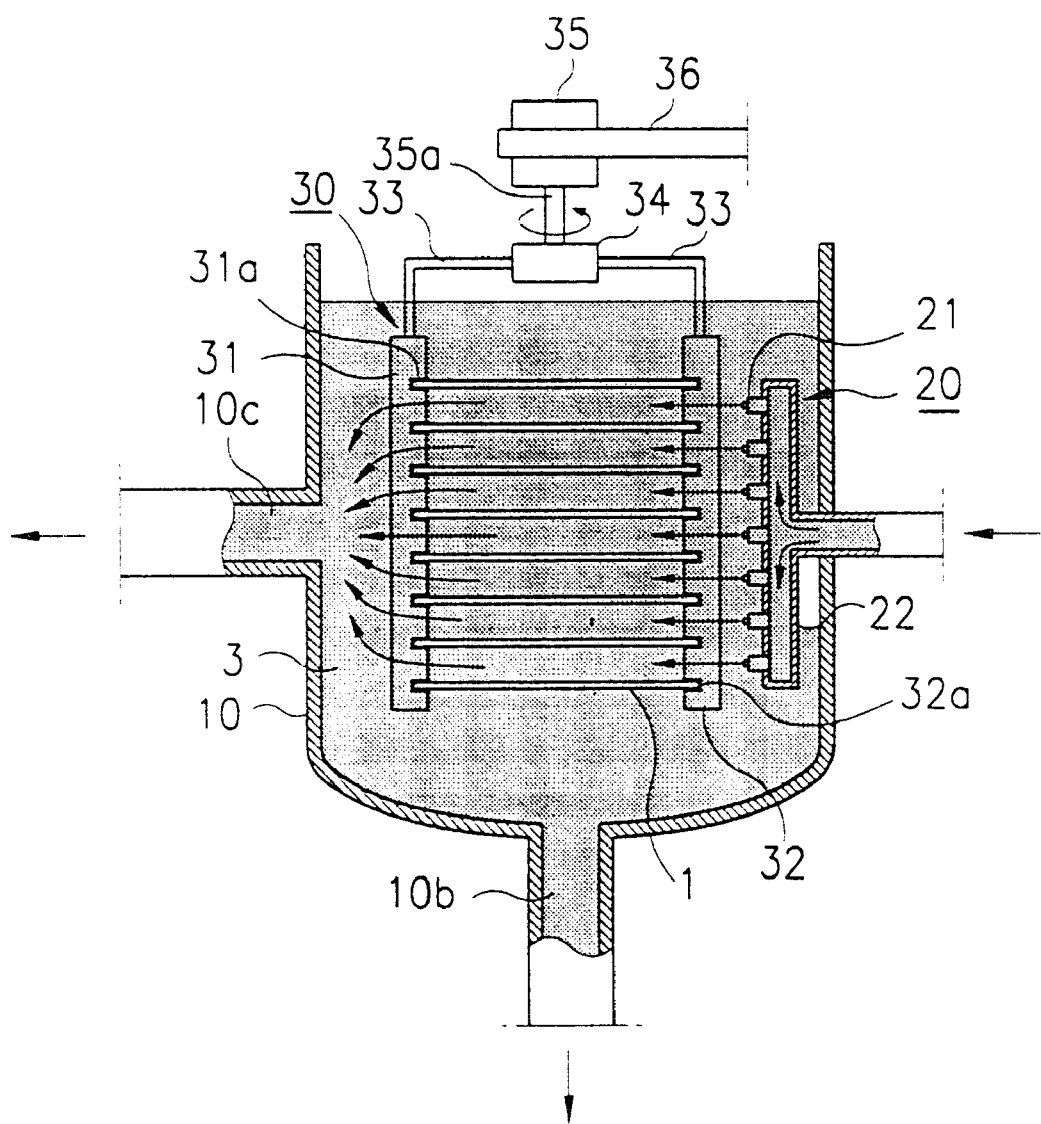
FIG. 5 is a schematic sectional view to show a bath according to another embodiment of the present invention.

As shown in FIG. 5, the discharge outlet of the bath 10 can be formed on the side wall of the bath 10, i.e. a discharge outlet 10c is provided on one side wall of the bath, opposite to the chemical spray part 20 to facilitate easy flow of the chemical 3. Only one of the above side discharge outlet 10c can be formed on the bath 10, or, if necessary, the bottom outlet 10b and the side outlet 10c can be together provided in the bath 10 so that the chemical 3 can be completely discharged.

Figure 6:
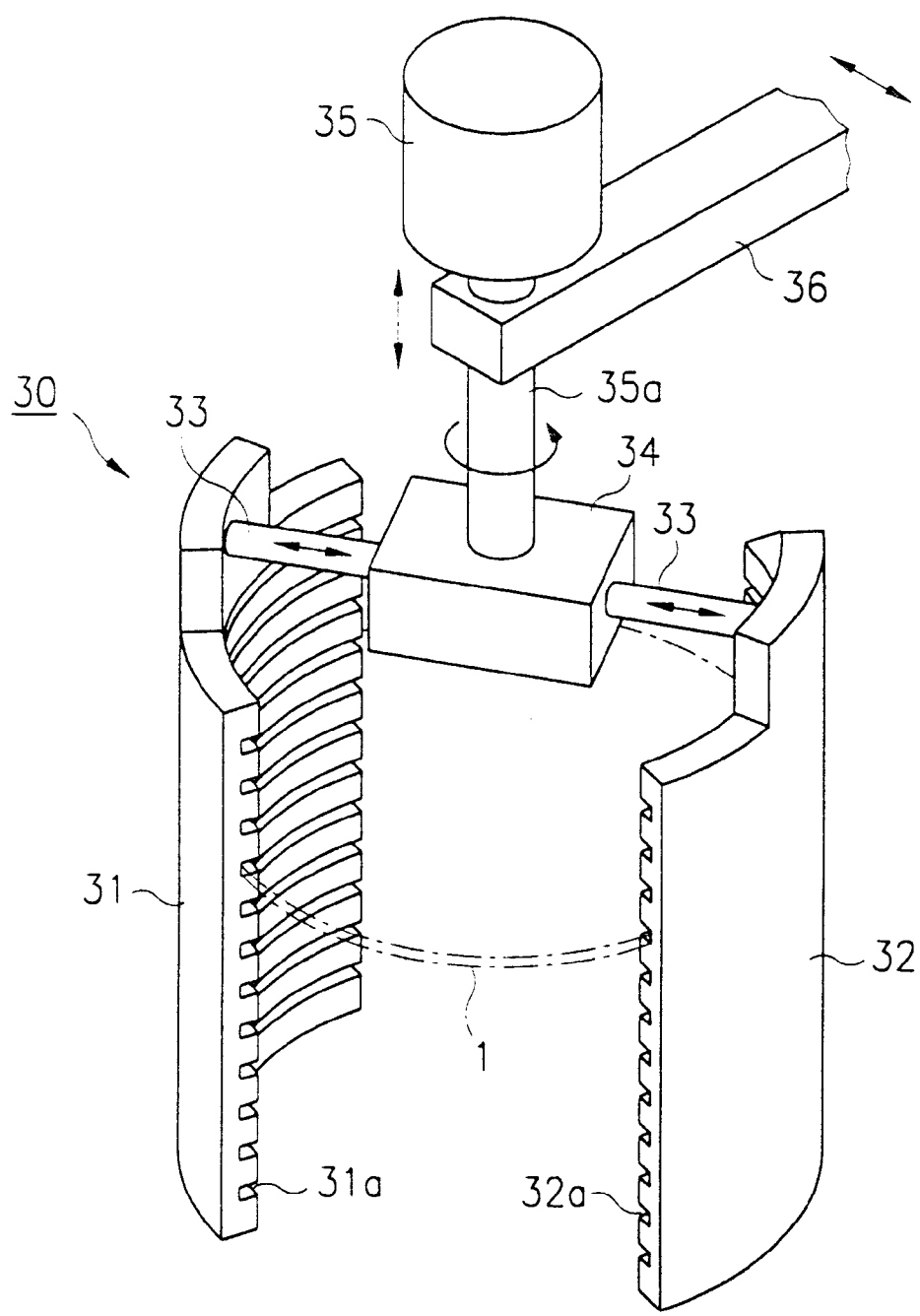
FIG. 6 is a perspective view to show a wafer guide according to the present invention.

As shown in FIG. 6, the wafer guide 30 is shaped in a manner that a plurality of horizontal slots 31a corresponding to the circumferential side of the wafer 1 are formed on its inner wall, a plate-shaped left moving member 31 is provided to horizontally pressurize the plurality of wafers 1 loaded between the slots 31a with contacted with the left edge side of the wafer 1, and a plate-shaped right moving member 32 is provided to horizontally pressurize the plurality of wafers 1 loaded between the slots 32a with contacted with the right edge side of the wafer 1.

Figure 7:
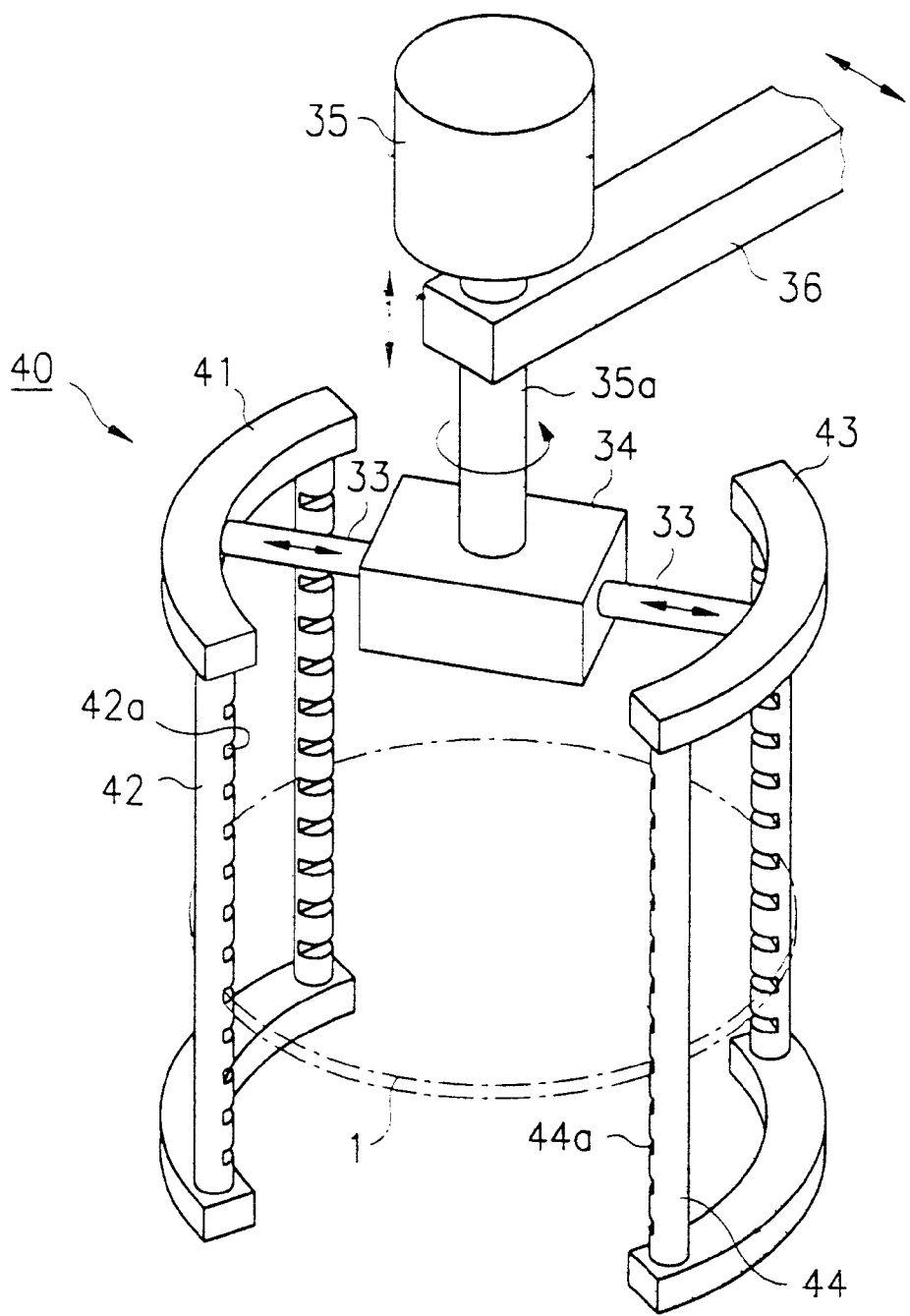
FIG. 7 is a perspective view to show a wafer guide according to another embodiment of the present invention.

Instead of the above plate-shaped left, right moving members 31, 32, as shown in FIG. 7, bended bar-shaped left and right moving members 41,43 can be provided, each comprising two members up and down respectively. Between the up/down members of each of the left and right moving members 41,43, there are provided rods 42, 44, each comprising two members, vertically being extendedly connected between its respective moving member, and having a plurality of slots thereinside, a set of two members of one moving member and two rods being integrated.

That is, the wafer 1 is caught, its edge being inserted into the four of slots 42a, 44a formed on the rods 42,44, which is intended to minimize the contact area with the wafer 1.

In addition, the wafer guide 30, as shown in FIG. 6, is constructed in a manner that a cylinder 34 extends/contracts the two of the piston 33 which are provided between the left/right moving members 31,32 to control the distance of the left moving member 31 and the right moving member 32.

Therefore, the wafer 1 is horizontally fixed between the left/right moving members 31,32 by the pressure therefrom if the piston 33 is contracted by the cylinder 34.

The wafer guide 30 is installed over the bath 10, and is installed on one end of the robot arm 36 which is movable up/down and left/right by the robot (not shown).

As a wafer guide rotation apparatus for activating the etching process by rotating the wafer 1, a motor 35 is installed on the front end of the robot arm 36, and the rotation force of the rotation shaft 35a rotating by the motor 35 is transmitted to the wafer guide 30 to rotate the wafer guide 30.

That is, by moving the chemical 3 on the surface of the wafer 1 horizontally held by the wafer guide 30 by means of the rotation of the wafer 1, the chemical reaction of the chemical 3 can be activated.

Figure 8:
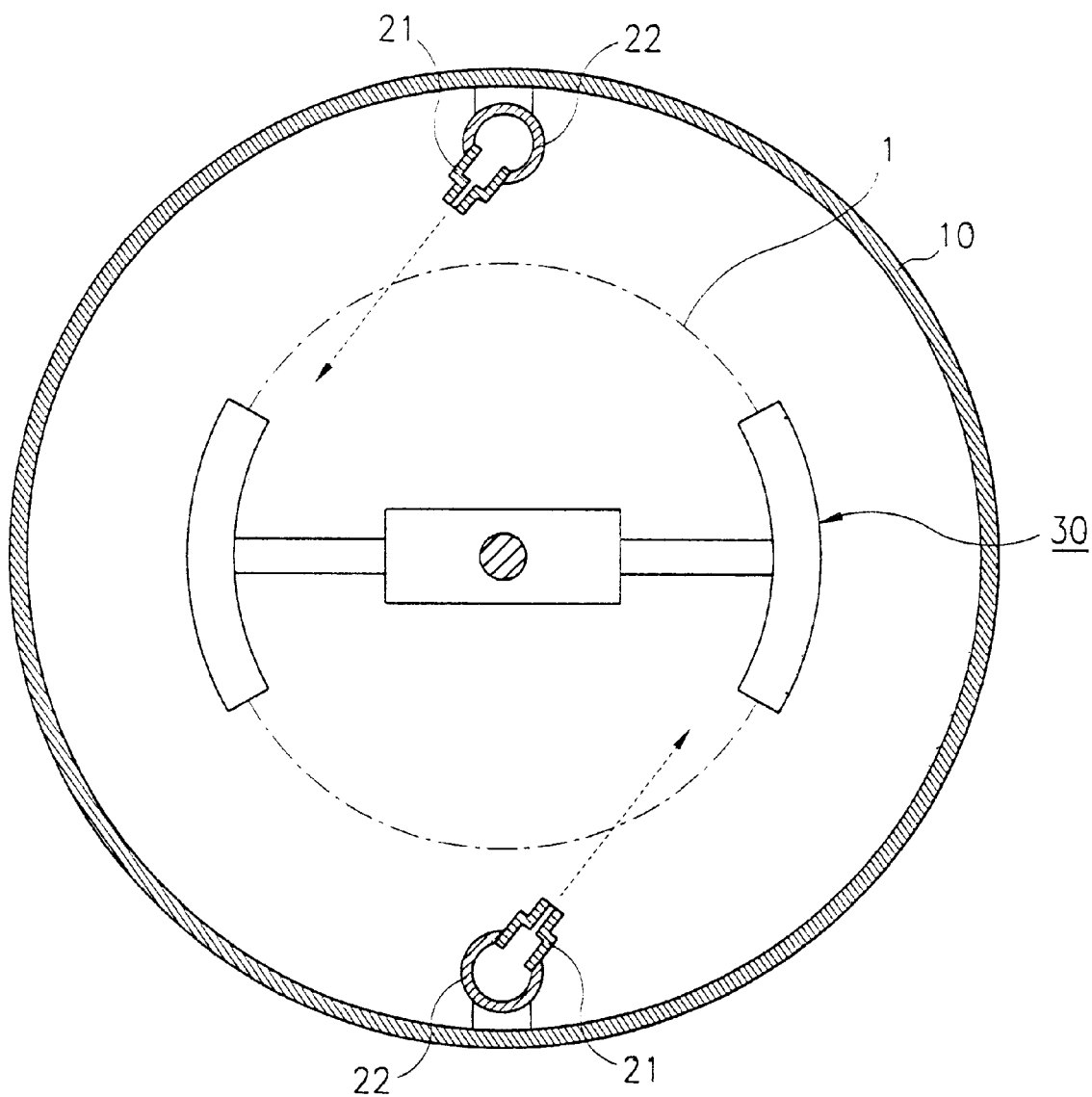
FIG. 8 is a plane view to show the displacement state of the chemical spray line of the present invention.

In addition, the chemical spray part 20 of the present invention, as shown in FIG. 3 and FIG. 8, comprises a nozzle 21 and a chemical spray line 22. The nozzle 21 is constructed with a plurality of nozzles between the plurality of the wafers 1 to spray the chemical 3 to the plurality of the wafers 1 so that the chemical 3 flows along the surface of the wafers 1. On one end of the chemical spray line 22, there are provided a plurality of nozzles 21, and the chemical spray line 22 is connected to the chemical supply part so as to supply the chemical 3 to the plurality of nozzles 21.

The nozzle 21, as shown in FIG. 8, is installed on the side walls of the bath 10 inclined in the radial direction of the bath 10 from the center of the wafer 1 such that the chemical 3 is rotated inside the bath 10 centering the wafer 1.

The installment location of the nozzle 21 and the chemical spray line 22 are formed with an equal interval centering the wafer 1, and the plurality of nozzles 21 can be installed on the side wall of the bath 10.

Therefore, the chemical 3 sprayed from the nozzle 21 flows obliquely along the surface of the wafer 1 centering the center of the wafer 1, and away from its center. The flow of the chemical 3 causes the vortex of the chemical inside the bath 10 to further activate the etching process of the chemical 3.

In addition, by rotating the wafer guide 30 to the opposite direction of the vortex flow of the chemical by the motor 35 of the wafer guide rotation apparatus, the etching process can be further activated.

Therefore, as shown in FIG. 3, the wafer guide 30 holding the plurality of wafers 1 moves down by the robot arm 36, and when the wafers 1 are immersed into the chemical 3, the chemical 3 of a high pressure is sprayed to the wafers 1, and the wafer guide 30 is rotated by the motor 35 to perform the etching process on the wafer 1.

The wet-etching facility for manufacturing semiconductor devices of the present invention performs the wet-etching process by supplying a certain amount of the chemical 3 to the bath 10, and immersing the wafers 1 to the chemical 3 contained in the bath 10, but however, according to the present invention, the facility can be employed on the spray manner in which the chemical is sprayed on the wafer 1 exposed in the air without the supply of a certain amount of the chemical 3.

Figure 9:
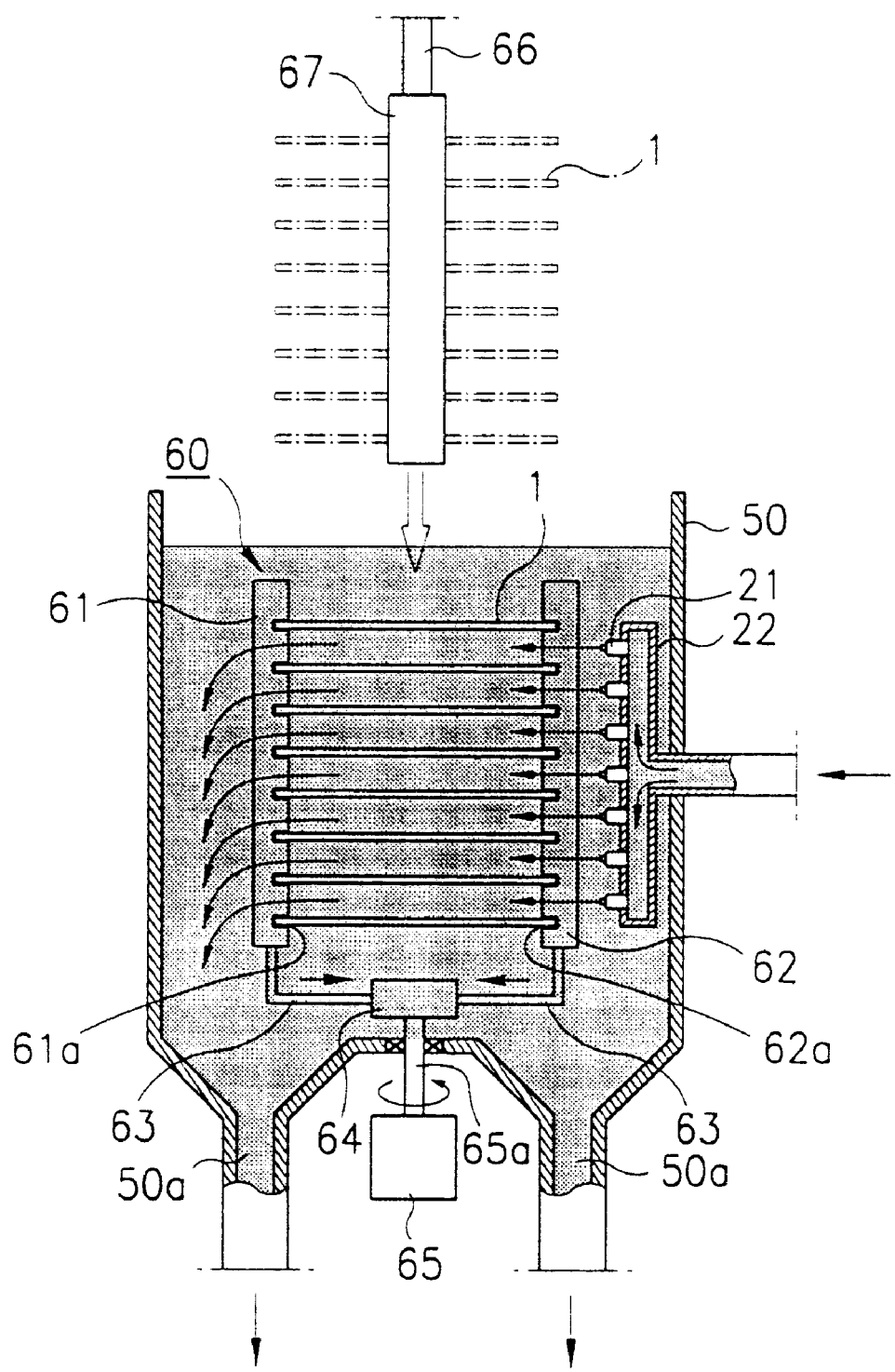
FIG. 9 is a sectional view to schematically show the wet-etching facility for manufacturing semiconductor devices according to another embodiment of the present invention.

Meanwhile, the wet-etching facility for manufacturing semiconductor devices according to another embodiment of the present invention, as shown in FIG. 9, is constructed in a manner that a wafer guide 60 is installed on the bottom center of the bath 50, a wafer guide 60 holding the wafers 1 is installed inside the bath 50, and the wafer guide 60 is rotated by the motor 65, and rotatably supported by the bearing installed under the bath 50.

In the embodiment, the bath 50 is constructed to protrude upwardly from the bottom center on which the wafer guide 60 is installed, and the bottom edge is concave to form a discharge outlet 50a on the concave location for complete discharge of the chemical 3.

In addition, the rotation location of the wafer guide 60 is fixed, and the plurality of wafers 1 are held placed between the left moving member 61 and the right moving member 62 by the cylinder 64 to extend and contact the piston 63. A transfer 67 as one of the wafer transfer apparatus to place the wafer 1 between the left/right moving members 61,62 carries the wafer 1.

That is, the transfer 67 comprises left/right moving members, a piston and a cylinder as same as the wafer guide 60. Unlike the wafer guide 60, its top being open between the left/right moving members 61,62, the bottom of the wafer guide 60 is open.

In addition, the transfer 67 is operated in the same manner as the wafer guide 60, and selectively holds the wafers 1 loaded on the slots, which are aligned with an equal interval as the wafer guide 60 by the cylinder. The wafers 1 are loaded/unloaded between the left/right moving members 61,62 of the wafer guide 60 with installed by the ascending robot arm 66.

The transfer 67 holds the portion of the wafers 1 with which the slots 61a, 62a of the left/right moving members 61,62 of the wafer guide 60 do not contact, and preferably, the holding line connecting the both holding points by the transfer 67 and the holding line connecting the both holding points by the wafer guide 60 are rectangularly traversed.

Therefore, the transfer 67 holds the plurality of wafers 1 standing-by in a certain location with slot interval, and places them to the upper side of the bath 50 by the robot arm 66. The wafers 1 move down by the robot arm 66, and the wafers 1 are placed between the left/right moving members 61,62 of the wafer guide 60 inside the bath 50.

Then, the wafers 1 held by the transfer 67 are held by the left/right moving members 61,62 of the wafer guide 60, and the transfer 67 moves up by the robot arm 66, and stays until the process is completed on the upper side of the bath 50.

Then, the wafer guide 60 received the wafers 1 from the transfer 67 horizontally rotates the wafers 1, and at the same time, the etching process is carried out by the chemical 3 is sprayed from the nozzle 21.

The transfer 67 is one kind of the wafer transferring means, and various types and shapes of the transfer apparatus can be employed except the above transfer 67, which is apparent to those skilled in the art, and some modification and alteration can be possible within the scope and the spirit of the present invention.

Figure 10:
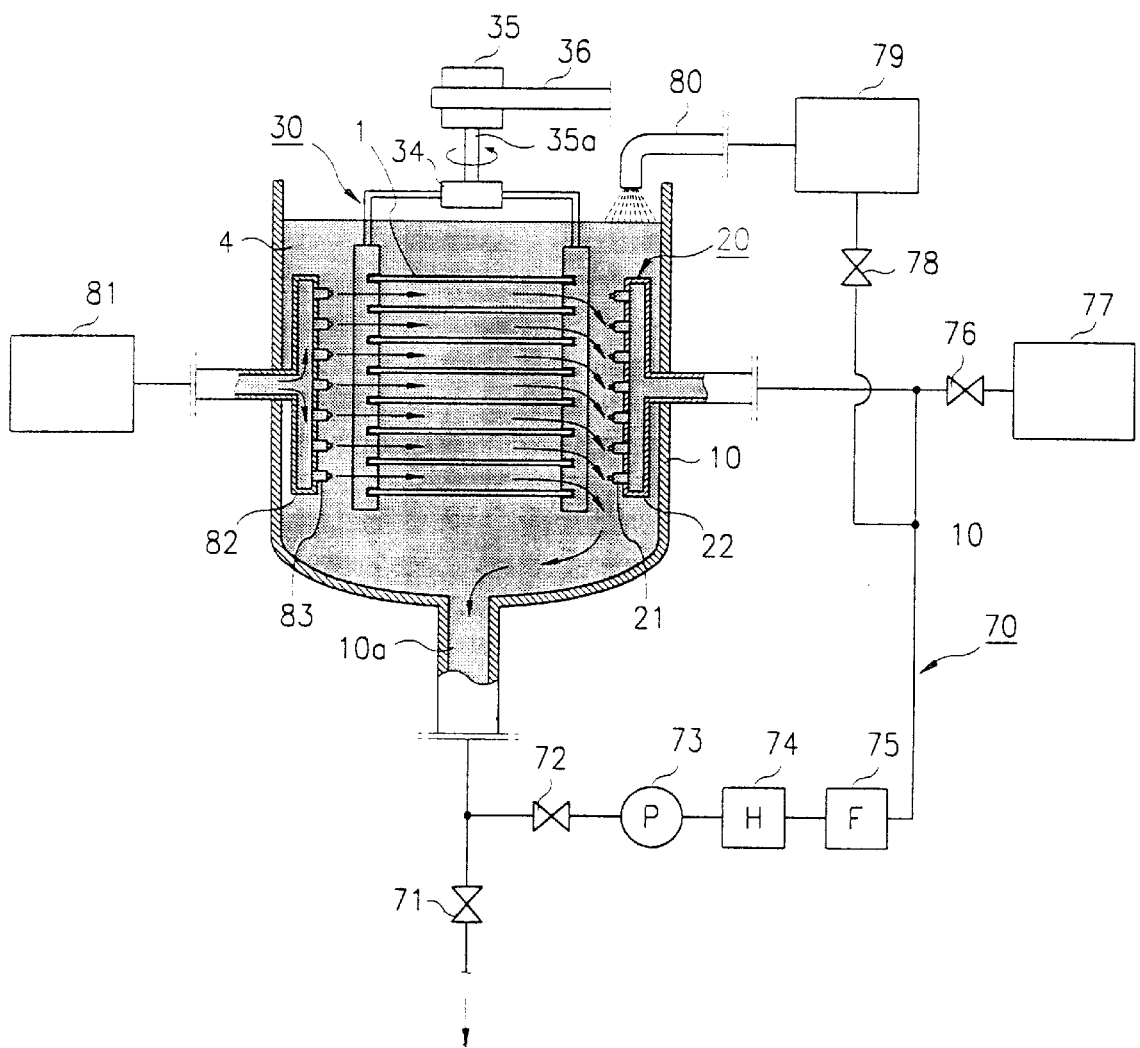
FIG. 10 is a sectional view to schematically show the wet-etching facility for manufacturing semiconductor devices according to still another embodiment of the present invention.

Meanwhile, as shown in FIG. 10, according to further embodiment of the present invention, the wet-etching facility for manufacturing semiconductor devices is constructed in a manner that some of the chemical 3 discharged from the chemical discharge part is filtering-treated, and the chemical 3 is collected to the chemical spray part 20 by the open/close operation of a valve 72 to be recirculated to the chemical spray part 20. Through a filter 75, a pump 73, and a heater 74 installed on a circulation line 70 connecting the chemical discharge part and the chemical spray part 20.

That is, the circulation line 70 is constructed such that a chemical supply line connecting the chemical spray part 20 and the chemical supplier 77 is connected with a discharge line connected to a discharge outlet 10a and installed on a valve 71.

That is, the circulation line 70 comprises a valve 72, a pump 73 to cause the flow inside the line by the pressure difference, a heater 74 to maintain the temperature of the chemical 3 to a certain degree, and a filter 75 to filter the chemical 3.

Therefore, the chemical stored inside the chemical supplier 77 passes through the nozzle 21 of the chemical spray line 22, and is horizontally sprayed between the wafers 1, and at the same, is discharged downwardly through the discharge outlet 10a with the contaminants. The discharged chemical passes along the circulation line 70, and is supplied to the chemical spray part 20 with the impurities therein removed by the filter 75, and maintaining a certain degree of the temperature.

As shown in FIG. 10, the wet-etching facility for manufacturing semiconductor devices is constructed in a manner that deionized water 4 is supplied to the bath 10 to clean the wafer 1 and the bath 10 and a cleaning solution supply part is provided on the chemical spray part 20 to clean the chemical discharge line, the circulation line 70 and the chemical supply line by supplying deionized water.

The cleaning solution supply part comprises a deionized water supplier 79 having deionized water therein, a deionized water supply line to supply the deionized water stored inside the deionized water supplier 79 through a deionized water supply line 80 connected to the upper side of the bath 10 to the bath 10, and a deionized water supply line connected to the circulation line 70 and supplying the deionized water stored inside the deionized water supplier 79 to the circulation line 70 by the open/close operation of the valve 78.

In addition, the wet-etching facility for manufacturing semiconductor devices according to the present invention, as shown in FIG. 10, may further comprises a cleaning solution spray part to spray the cleaning solution to the wafer 1 with a high pressure to flow the cleaning solution along the surface of the wafer 1.

The cleaning solution spray part is constructed to clean the wafer 1 after the etching process by the chemical 3 after completely discharging the chemical through the discharge outlet 10a, and is constructed in a manner that a plurality of them are installed between each of the wafers 1 to spray the deionized water between the wafers 1, a nozzle 83 is installed to spray a high pressure of deionized water between the wafers 1, a plurality of nozzles 83 are installed on one end, a cleaning solution supplier 81 having cleaning solution to be supplied to the nozzle 83 therein, and a cleaning solution spray line 82 is connected to the cleaning solution supplier 81.

Therefore, the deionized water stored inside the deionized water supplier 81 passes through the nozzles 83 of the deionized water spray line 82, and is horizontally sprayed between the wafers 1, and is discharged downwardly through the discharge outlet 10a with the impurities generated in the etching process.

Here, the discharged deionized water 4 can be resupplied to the bath 10 along the circulation line 70 after the impurities are removed by the filter 75.

Figure 11:
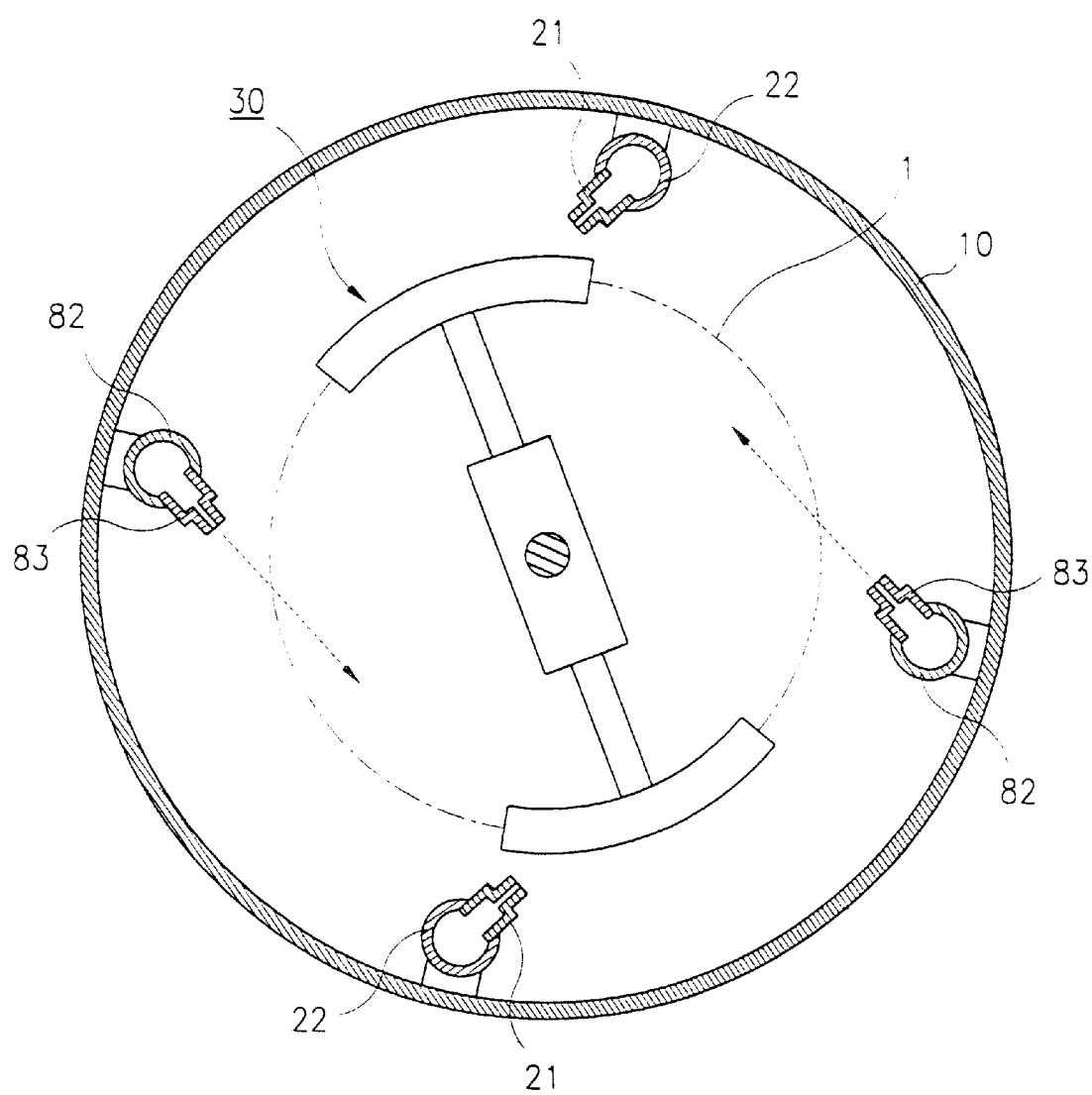
FIG. 11 is a plane view to show the displacement state of the deionized water spray line employed on the embodiment of FIG. 10.

In addition, the nozzle 83, as shown in FIG. 11, is obliquely installed in the radial direction of the bath 10 from the center of the wafer 1 such that the deionized water 4 is rotated inside the bath 10, forming vortex centering the wafer 1, and the nozzle 83 are installed between the chemical spray line 22 on the both side wall between of the bath 10 with equal interval centering the wafer 1.

Therefore, the deionized water 4 sprayed from the nozzle 83 passes through the wafer surface, and thrown away the wafer surface obliquely centering the wafer 1. By the flow of the deionized water 4, the vortex of the deionized water 4 is caused in the bath 10, and cleaning efficiency of the deionized water can be increased.

In addition, by rotating the wafer 1 to the opposite direction of the vortex of the deionized water 4 by the motor 35 of the wafer guide rotation apparatus, the cleaning efficiency can be increased.

Here, a deionized water circulation line is installed on the deionized water spray part connected to the discharge line 10a of the bath 10. The shape of the deionized water spray part can be variously modified.

Therefore, after the etching process by chemical, the chemical is completely discharged by opening the valve 71 of the discharge outlet, and by closing the valve 71, a certain amount of deionized water 4 is supplied into the bath 10 to clean the wafer 1 and the bath 10 through the deionized water supply line 80.

Then, when the wafer 1 is immersed into the deionized water 4, the valve 72 is open, and the deionized water 4 is circulated into the bath 10 along the circulation line 70, and at the same time, by opening the valve 78 to clean the circulation line 70, the deionized water 4 is supplied to the circulation line 70.

At this time, the high pressure of deionized water 4 is sprayed on the surface of the wafer 1 through the nozzle 83 installed on the deionized water spray line 82 so that the cleaning is completed.

Figure 12:
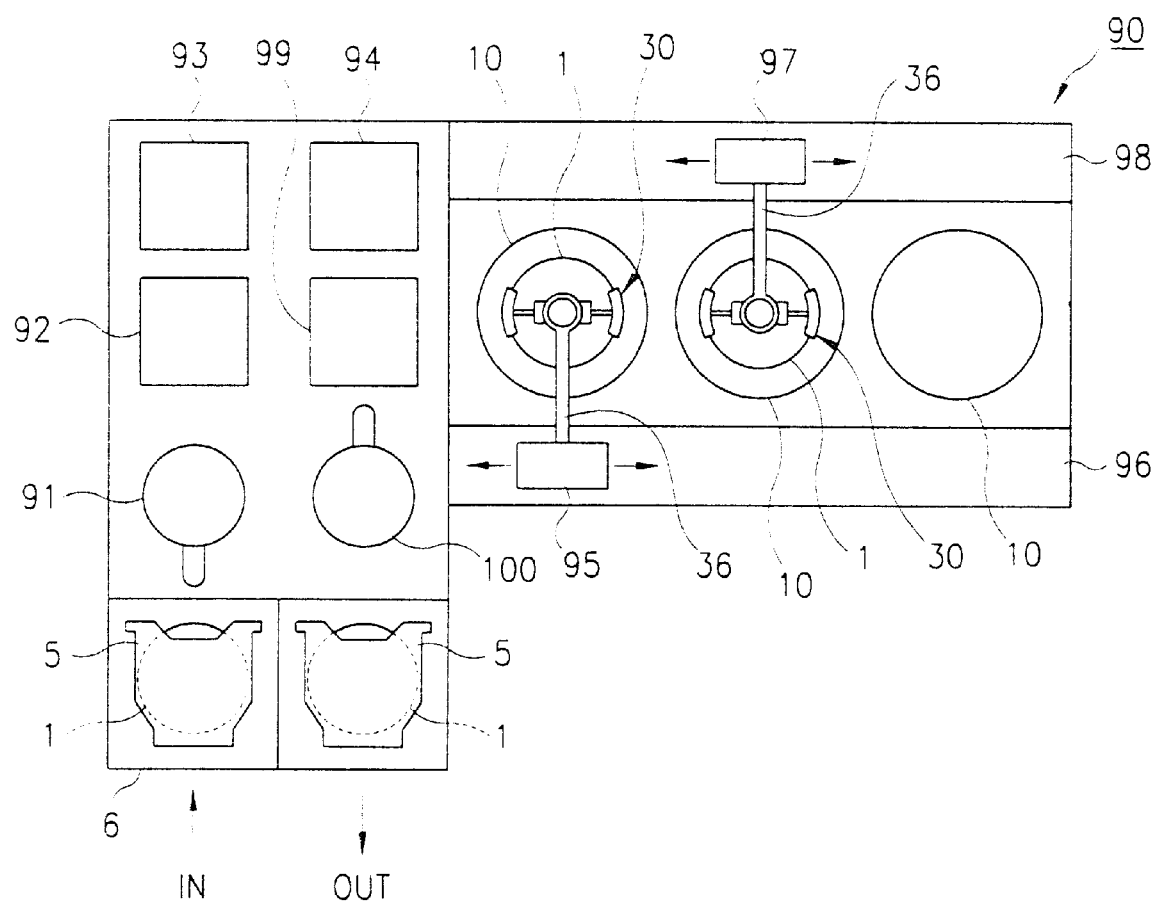
FIG. 12 is a schematic view to show multi-etching facility having a plurality of baths according to one embodiment of the present invention.
Figure 13:
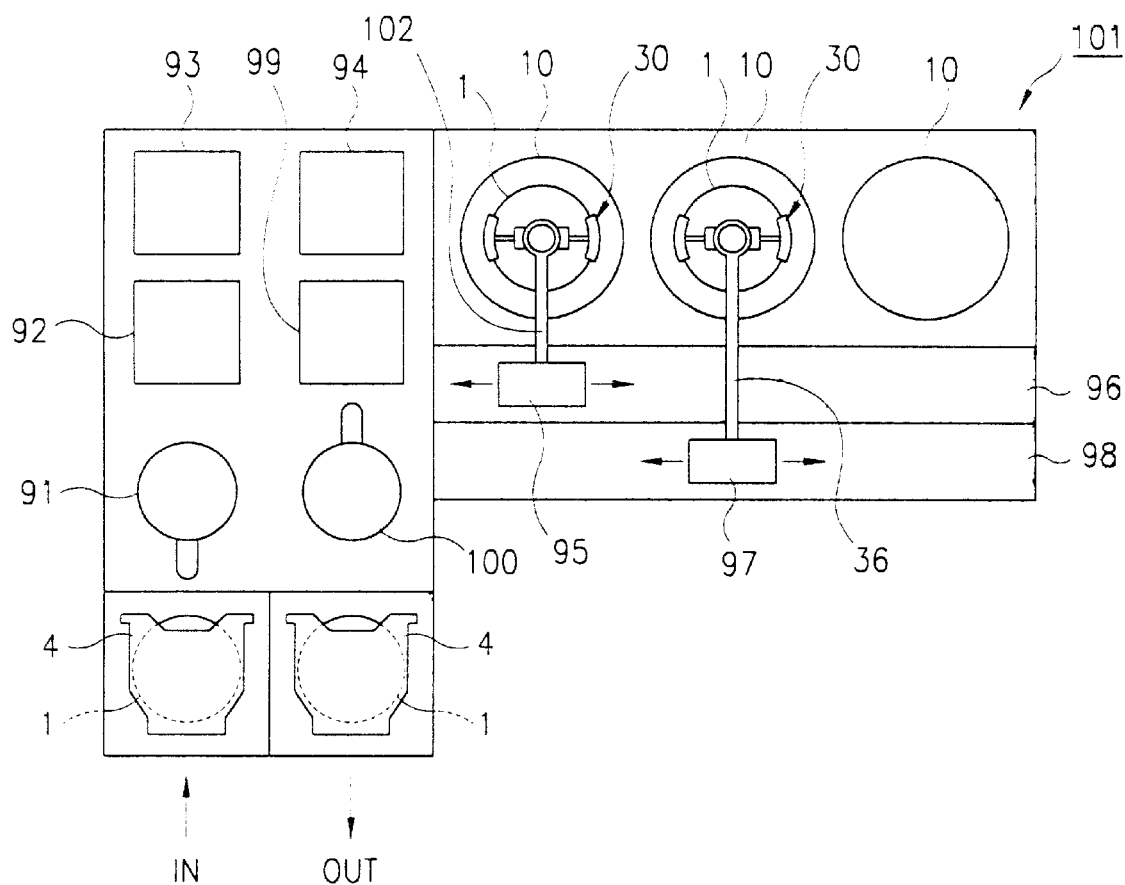
FIG. 13 is a schematic view to show multi-etching facility having a plurality of baths according to another embodiment of the present invention.

Meanwhile, as shown in FIGS. 12 and 13 showing the embodiments of the multi etching facility having three of baths 10, as shown in FIG. 12, the multi etching facility 90 according to one embodiment of the present invention, in the wet etching facility for manufacturing semiconductor devices as described above, the facility 90 comprises a cassette 5 loading a plurality of wafers 1, a cassette stage 6 on which an empty cassette 5 is mounted, a transfer apparatus 91 to transfer the wafers in the cassette 5 to the wafer stand-by part 92, a wafer aligning apparatus 93 to align the plurality of wafers 1 loaded on the wafer stand-by part 92 with a certain interval with the used surface of the wafer faced down, a loading buffer part 94 to stand-by to load the plurality of wafers 1 with their used surface faced down by the wafer aligning apparatus 93, first/second transfer robots 95, 97 to hold the plurality of wafers 1 standing in the loading buffer part 94 by the wafer guide 30, and reciprocally passing the robot path 96,98 installed on the both side of the facility to load/unload them to a specific bath 10 respectively, an unloading buffer part 99 for standing-by the plurality of wafers 1 unloaded by the first/second transfer robot 95,97, and a transfer apparatus 100 to load the plurality of wafers 1 standing in the unloading buffer part 99 into an empty cassette 5.

Therefore, if the cassette 5 is transferred to the cassette stage 6 by an operator or a cassette transfer robot, etc., the wafers 1 loaded on the cassette 5 are transferred to the wafer stand-by part 92 by the transfer apparatus 91, and aligned by the wafer aligning apparatus 93 with the used surface facing downward so that the wafers are aligned in the loading buffer part 94.

Then, the first/second transfer robots 95,97 hold the plurality of wafers 1 aligned in the loading buffer part 94 to the wafer guide 30, and the wafers are loaded in the specific bath 10 so that the wafers 1 are horizontally rotated and the wafer 1 is etched.

Then, the wafers 1 after etching are unloaded on the unloading buffer part 99 by the first/second transfer robots 95, 97, and the unloaded wafers are again loaded in an empty cassette 5 standing by the transfer apparatus 100.

Then, the first transfer robot 95 and the second transfer robot 97 are installed facing each other to the opposite sides, but the alteration and modification of the displacement location of the each components in the multi etching facility 90 can be possible which is apparent to those skilled in the art. As shown in FIG. 13, the multi etching facility 101 is constructed in a manner that two of the robot paths 104, 105 are aligned in parallel on one side of the facility, and a first transfer robot 106 and a second transfer robot 107 are installed on the robot paths 104,105 to face the same direction, wherein the robot arms 102, 103 of the first transfer robot 106 and the second transfer robot 107 have different length, and their installation height are different so that the wafers 1 are loaded/unloaded without the interference of the first transfer robot 106 and the second transfer robot 107.

Figure 4:
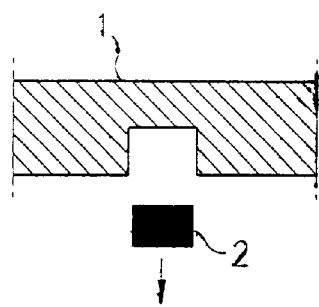
FIG. 4 is a partial enlarged view to show the wafer, of FIG. 3, which is etched by chemical in detail.

Therefore, as shown in FIG. 4, the impurities 2 on the wafer 1 to be etched by chemical are detached from the wafer 1 by gravity since the used surface of the wafer 1 is in the horizontal state, and faced down, and the contamination on the used surface of the wafer by the impurities on the back side of the wafer can be prevented since the impurities should be lifted overcoming the gravity so that the impurities on the unused surface of the wafer 1, i.e., the back side of the wafer 1 reaches the used surface of other wafer.

In addition, as shown in FIG. 3, since the plurality of wafers 1 are held by the both slots 31a, 32a of the wafer guide 30 to be horizontally laid, the shaking of the wafer 1 is little during the transfer, and the generation of the particles generated by the shock on the wafer 1 and the breakage of the wafer can be prevented.

In addition, since the plurality of wafer 1 can be loaded/unloaded with laid horizontally in the semiconductor device fabrication line in which the wafers are generally transferred with loaded horizontally, the facility can be simple without any other extra wafer transfer apparatus, and the productivity can be increased because of shortened transfer time.

In addition, the cylindrical shape of the bath 10 improves and facilitates the spiral rotation of chemical 3, and the flow of the chemical 3 is Down Flow, flowing from up to down to be matched with the direction of gravity, a small capacity of the pump makes a great effect, and the flow inside the bath 10 can be uniformly maintained so that the wafer 1 can be uniformly made.

As described above, in the wet-etching facility for manufacturing semiconductor devices according to the present invention, the impurities are completely removed from the wafer, and the quality of the produced wafers can be increased. In addition, the transfer of the wafers is simple, and the facility can be simplified, and the uniform process for wafers can be possible to prevent the partial vortex or the breakage inside the bath.

What is claimed is:

1. A wet-etching facility for manufacturing semiconductor devices comprising:
   a bath containing a predetermined amount of chemical;
   a chemical supply part for supplying an amount of the chemical to the bath;
   a chemical discharge part for discharging the chemical inside the bath to outside of the bath;
   a wafer guide for holding and fixing a wafer with its used surface facing downward, and placing the wafer into a chemical;
   a transfer robot for loading and unloading the wafer into the wafer guide; and
   a chemical spray part for spraying the chemical at a high pressure such that the chemical flows along a surface of the wafer.

2. The wet-etching facility for manufacturing semiconductor devices of claim 1, wherein the bath is cylindrical-shaped, its top being open.

3. The wet-etching facility for manufacturing semiconductor devices of claim 1, wherein the bottom of the bath is hemisphere-shaped to facilitate easy discharge of the chemical, and a discharge outlet is formed on the lowest point of the hemisphere-shaped bottom.

4. The wet-etching facility for manufacturing semiconductor devices of claim 1, wherein the bath has a discharge outlet on one wall facing the chemical spray part to facilitate easy flow of the chemical.

5. The wet-etching facility for manufacturing semiconductor devices of claim 1, wherein the chemical supply part and the chemical discharge part are connected via a circulation line including a filter, a pump, and a heater such that some of the chemical discharged from the chemical discharge part, passes through according to an open/close position of the valve, and is collected and circulated into the chemical supply part.

6. The wet-etching facility for manufacturing semiconductor devices of claim 1, wherein the wafer guide comprises:
   left and right moving members having a plurality of slots contacting an edge of each of the plurality of wafers horizontally held between the slots; and
   a cylinder installed between the left and right moving members, and extending/contracting the pistons connected with the left/right moving members to control the distance between the left moving member and the right moving member.

7. The wet-etching facility for manufacturing semiconductor devices of claim 1, wherein the wafer guide is installed on the upper side of the bath, and on one end of a robot arm, which can move up/down or left/right by a transfer apparatus.

8. The wet-etching facility for manufacturing semiconductor devices of claim 1, wherein the wafer guide is installed on the bath.

9. The wet-etching facility for manufacturing semiconductor devices of claim 1, wherein the chemical spray part comprises:
   a plurality of nozzles installed on each of the wafers to spray chemical to the wafers at a high pressure; and
   a chemical spray line having a plurality of nozzles on its end, and connected with the chemical supply part to supply chemical to the nozzles.

10. The wet-etching facility for manufacturing semiconductor devices of claim 9, wherein the nozzles are installed obliquely radially inside the bath away from the center of the wafer such that the chemical is rotated spirally over the wafer inside the bath.

11. The wet-etching facility for manufacturing semiconductor devices of claim 1, wherein a plurality of the chemical spray parts are installed on the side wall of the bath, which are aligned in a same interval centering the wafer.

12. The wet-etching facility for manufacturing semiconductor devices of claim 1, further comprising a wafer guide rotation apparatus for rotating the wafer guide to rotate the wafer by transmitting the rotation force of the motor to the wafer guide by a driving force transfer apparatus.

13. The wet-etching facility for manufacturing semiconductor devices of claim 1, wherein a cleaning solution supply part is further provided in the bath to clean the wafer and the bath.

14. The wet-etching facility for manufacturing semiconductor devices of claim 1, wherein a cleaning solution supply part is further provided in the chemical spray part to clean the inside of the chemical discharge part, and the chemical spray part.

15. The wet-etching facility for manufacturing semiconductor devices of claim 1, further comprising a cleaning solution spray part for high-pressure spraying the cleaning solution to the wafer such that the flow of the cleaning solution is formed on the surface of the wafer.

16. The wet-etching facility for manufacturing semiconductor devices of claim 15, wherein the cleaning spray part comprises:

a plurality of nozzles installed on each of the wafers to spray cleaning solution to the wafers at a high pressure such that the cleaning solution is sprayed between the plurality of wafers; and a cleaning solution spray line having a plurality of nozzles on its end, and connected with the cleaning solution supply part to supply cleaning solution to the nozzles.

17. The wet-etching facility for manufacturing semiconductor devices of claim 16, wherein the nozzles are installed obliquely radially inside the bath away from the center of the wafer such that the cleaning solution is rotated spirally over the wafer inside the bath.

18. The wet-etching facility for manufacturing semiconductor devices of claim 15, wherein a plurality of the cleaning solution spray parts are installed on the side wall of the bath, which are aligned in a same interval centering the wafer.

19. The wet-etching facility for manufacturing semiconductor devices of claim 1, further comprising:

a cassette stage having a cassette mounted thereon, a plurality of wafers loaded on the cassette; and a wafer aligning apparatus for aligning the plurality of wafers loaded on the cassette on a buffer part so as to face down the used surface of the wafer and align them in a constant interval.

* * * * *